(12) United States Patent
Polansky et al.

(10) Patent No.: US 7,743,230 B2
(45) Date of Patent: *Jun. 22, 2010

(54) MEMORY ARRAY PROGRAMMING CIRCUIT AND A METHOD FOR USING THE CIRCUIT

(75) Inventors: Yan Polansky, Ramat Gan (IL); Avi Lavan, Yokneam-Elit (IL)

(73) Assignee: Saifun Semiconductors Ltd., Netanya (IL)

( * ) Notice: Subject to any disclaimer, the term of this patent is extended or adjusted under 35 U.S.C. 154(b) by 244 days.

This patent is subject to a terminal disclaimer.

(21) Appl. No.: 11/704,908

(22) Filed: Feb. 12, 2007

(65) Prior Publication Data

US 2007/0168637 A1    Jul. 19, 2007

Related U.S. Application Data

(63) Continuation of application No. 10/653,388, filed on Sep. 3, 2003, now Pat. No. 7,178,004.

(60) Provisional application No. 60/443,871, filed on Jan. 31, 2003.

(51) Int. Cl.
*G06F 12/00* (2006.01)
(52) U.S. Cl. ....................................... 711/202
(58) Field of Classification Search ........................ None
See application file for complete search history.

(56) References Cited

U.S. PATENT DOCUMENTS

| | | |
|---|---|---|
| 3,881,180 A | 4/1975 | Gosney, Jr. |
| 3,895,360 A | 7/1975 | Cricchi et al. |
| 3,952,325 A | 4/1976 | Beale et al. |
| 4,016,588 A | 4/1977 | Ohya et al. |
| 4,017,888 A | 4/1977 | Christie et al. |
| 4,145,703 A | 3/1979 | Blanchard et al. |
| 4,151,021 A | 4/1979 | McElroy |
| 4,173,766 A | 11/1979 | Hayes |
| 4,173,791 A | 11/1979 | Bell |
| 4,247,861 A | 1/1981 | Hsu et al. |
| 4,257,832 A | 3/1981 | Schwabe et al. |

(Continued)

FOREIGN PATENT DOCUMENTS

EP    0 656 628    6/1995

(Continued)

OTHER PUBLICATIONS

U.S. Appl. No. 08/902,890, filed Jul. 30, 1997, Eitan.

(Continued)

*Primary Examiner*—Hiep T Nguyen
(74) *Attorney, Agent, or Firm*—Eitan Mehulal Law Group (57) ABSTRACT

A multi-level cell (MLC) memory array may be programmed using a programming circuit having a binary input register to store data to be input into the MLC array and a register to store a programming vector, where each element in the programming vector corresponds to a charge storage region of an MLC in the array. A controller may map pairs of bits from the input register to elements in the programming vector, such that mapping a pair of bits to an element of the programming vector may set the vector element to a "program" value if the pair of bits corresponds to at least one specific program state associated with the programming vector.

35 Claims, 5 Drawing Sheets

U.S. PATENT DOCUMENTS

| | | |
|---|---|---|
| 4,281,397 A | 7/1981 | Neal et al. |
| 4,306,353 A | 12/1981 | Jacobs et al. |
| 4,342,102 A | 7/1982 | Puar |
| 4,342,149 A | 8/1982 | Jacobs et al. |
| 4,360,900 A | 11/1982 | Bate |
| 4,373,248 A | 2/1983 | McElroy |
| 4,380,057 A | 4/1983 | Kotecha et al. |
| 4,386,417 A | 5/1983 | Collins |
| 4,388,705 A | 6/1983 | Sheppard |
| 4,389,705 A | 6/1983 | Sheppard |
| 4,404,747 A | 9/1983 | Collins |
| 4,435,786 A | 3/1984 | Tickle |
| 4,448,400 A | 5/1984 | Harari |
| 4,471,373 A | 9/1984 | Shimizu et al. |
| 4,494,016 A | 1/1985 | Ransom et al. |
| 4,507,673 A | 3/1985 | Aoyama |
| 4,521,796 A | 6/1985 | Rajkanan et al. |
| 4,527,257 A | 7/1985 | Cricchi |
| 4,586,163 A | 4/1986 | Koike |
| 4,613,956 A | 9/1986 | Paterson et al. |
| 4,630,085 A | 12/1986 | Koyama |
| 4,663,645 A | 5/1987 | Komori et al. |
| 4,665,426 A | 5/1987 | Allen et al. |
| 4,667,217 A | 5/1987 | Janning |
| 4,672,409 A | 6/1987 | Takei et al. |
| 4,725,984 A | 2/1988 | Ip et al. |
| 4,733,105 A | 3/1988 | Shin et al. |
| 4,742,491 A | 5/1988 | Liang et al. |
| 4,758,869 A | 7/1988 | Eitan et al. |
| 4,760,555 A | 7/1988 | Gelsomini et al. |
| 4,761,764 A | 8/1988 | Watanabe |
| 4,769,340 A | 9/1988 | Chang et al. |
| 4,780,424 A | 10/1988 | Holler et al. |
| 4,839,705 A | 6/1989 | Tigelaar et al. |
| 4,847,808 A | 7/1989 | Kobatake |
| 4,857,770 A | 8/1989 | Partovi et al. |
| 4,870,470 A | 9/1989 | Bass, Jr. et al. |
| 4,888,735 A | 12/1989 | Lee et al. |
| 4,916,671 A | 4/1990 | Ichiguchi |
| 4,941,028 A | 7/1990 | Chen et al. |
| 4,961,010 A | 10/1990 | Davis |
| 4,992,391 A | 2/1991 | Wang |
| 5,021,999 A | 6/1991 | Kohda et al. |
| 5,027,321 A | 6/1991 | Park |
| 5,029,063 A | 7/1991 | Lingstaedt et al. |
| 5,042,009 A | 8/1991 | Kazerounian et al. |
| 5,075,245 A | 12/1991 | Woo et al. |
| 5,081,371 A | 1/1992 | Wong |
| 5,086,325 A | 2/1992 | Schumann et al. |
| 5,094,968 A | 3/1992 | Schumann et al. |
| 5,104,819 A | 4/1992 | Freiberger et al. |
| 5,117,389 A | 5/1992 | Yiu |
| 5,120,672 A | 6/1992 | Mitchell et al. |
| 5,142,495 A | 8/1992 | Canepa |
| 5,142,496 A | 8/1992 | Van Buskirk |
| 5,159,570 A | 10/1992 | Mitchell et al. |
| 5,168,334 A | 12/1992 | Mitchell et al. |
| 5,172,338 A | 12/1992 | Mehrotra et al. |
| 5,175,120 A | 12/1992 | Lee |
| 5,204,835 A | 4/1993 | Eitan |
| 5,214,303 A | 5/1993 | Aoki |
| 5,237,213 A | 8/1993 | Tanoi |
| 5,241,497 A | 8/1993 | Komarek |
| 5,260,593 A | 11/1993 | Lee |
| 5,268,861 A | 12/1993 | Hotta |
| 5,276,646 A | 1/1994 | Kim et al. |
| 5,280,420 A | 1/1994 | Rapp |
| 5,289,412 A | 2/1994 | Frary et al. |
| 5,293,563 A | 3/1994 | Ohta |
| 5,295,092 A | 3/1994 | Hotta |
| 5,295,108 A | 3/1994 | Higa |
| 5,305,262 A | 4/1994 | Yoneda |
| 5,311,049 A | 5/1994 | Tsuruta |
| 5,315,541 A | 5/1994 | Harari et al. |
| 5,324,675 A | 6/1994 | Hayabuchi |
| 5,334,555 A | 8/1994 | Sugiyama et al. |
| 5,335,198 A | 8/1994 | Van Buskirk et al. |
| 5,338,954 A | 8/1994 | Shimoji |
| 5,345,425 A | 9/1994 | Shikatani |
| 5,349,221 A | 9/1994 | Shimoji |
| 5,350,710 A | 9/1994 | Hong et al. |
| 5,352,620 A | 10/1994 | Komori et al. |
| 5,357,134 A | 10/1994 | Shimoji |
| 5,359,554 A | 10/1994 | Odake et al. |
| 5,361,343 A | 11/1994 | Kosonocky et al. |
| 5,366,915 A | 11/1994 | Kodama |
| 5,369,615 A | 11/1994 | Harari et al. |
| 5,375,094 A | 12/1994 | Naruke |
| 5,381,374 A | 1/1995 | Shiraishi et al. |
| 5,393,701 A | 2/1995 | Ko et al. |
| 5,394,355 A | 2/1995 | Uramoto et al. |
| 5,399,891 A | 3/1995 | Yiu et al. |
| 5,400,286 A | 3/1995 | Chu et al. |
| 5,402,374 A | 3/1995 | Tsuruta et al. |
| 5,412,601 A | 5/1995 | Sawada et al. |
| 5,414,693 A | 5/1995 | Ma et al. |
| 5,418,176 A | 5/1995 | Yang et al. |
| 5,418,743 A | 5/1995 | Tomioka et al. |
| 5,422,844 A | 6/1995 | Wolstenholme et al. |
| 5,424,567 A | 6/1995 | Chen |
| 5,424,978 A | 6/1995 | Wada et al. |
| 5,426,605 A | 6/1995 | Van Berkel et al. |
| 5,428,621 A | 6/1995 | Mehrotra et al. |
| 5,434,825 A | 7/1995 | Harari et al. |
| 5,436,478 A | 7/1995 | Bergemont et al. |
| 5,436,481 A | 7/1995 | Egawa et al. |
| 5,440,505 A | 8/1995 | Fazio et al. |
| 5,450,341 A | 9/1995 | Sawada et al. |
| 5,450,354 A | 9/1995 | Sawada et al. |
| 5,455,793 A | 10/1995 | Amin et al. |
| 5,467,308 A | 11/1995 | Chang et al. |
| 5,477,499 A | 12/1995 | Van Buskirk et al. |
| 5,495,440 A | 2/1996 | Asakura |
| 5,496,753 A | 3/1996 | Sakurai et al. |
| 5,508,968 A | 4/1996 | Collins et al. |
| 5,518,942 A | 5/1996 | Shrivastava |
| 5,521,870 A | 5/1996 | Ishikawa |
| 5,523,251 A | 6/1996 | Hong |
| 5,523,972 A | 6/1996 | Rashid et al. |
| 5,530,803 A | 6/1996 | Chang et al. |
| 5,534,804 A | 7/1996 | Woo |
| 5,537,358 A | 7/1996 | Fong |
| 5,544,116 A | 8/1996 | Chao et al. |
| 5,553,018 A | 9/1996 | Wang et al. |
| 5,553,030 A | 9/1996 | Tedrow et al. |
| 5,557,221 A | 9/1996 | Taguchi et al. |
| 5,557,570 A | 9/1996 | Iwahashi |
| 5,559,687 A | 9/1996 | Nicollini et al. |
| 5,563,823 A | 10/1996 | Yiu et al. |
| 5,566,125 A | 10/1996 | Fazio et al. |
| 5,568,085 A | 10/1996 | Eitan et al. |
| 5,579,199 A | 11/1996 | Kawamura et al. |
| 5,581,252 A | 12/1996 | Thomas |
| 5,583,808 A | 12/1996 | Brahmbhatt |
| 5,590,068 A | 12/1996 | Bergemont |
| 5,590,074 A | 12/1996 | Akaogi et al. |
| 5,592,417 A | 1/1997 | Mirabel |
| 5,596,527 A | 1/1997 | Tomioka et al. |
| 5,599,727 A | 2/1997 | Hakozaki et al. |
| 5,600,586 A | 2/1997 | Lee |
| 5,604,804 A | 2/1997 | Micali |
| 5,606,523 A | 2/1997 | Mirabel |
| 5,608,679 A | 3/1997 | Mi et al. |
| 5,612,642 A | 3/1997 | McClinyock |

| Patent | Date | Inventor |
|---|---|---|
| 5,617,357 A | 4/1997 | Haddad et al. |
| 5,619,452 A | 4/1997 | Miyauchi |
| 5,623,438 A | 4/1997 | Guritz et al. |
| 5,627,790 A | 5/1997 | Golla et al. |
| 5,633,603 A | 5/1997 | Lee |
| 5,636,288 A | 6/1997 | Bonneville et al. |
| 5,644,531 A | 7/1997 | Kuo et al. |
| 5,650,959 A | 7/1997 | Hayashi et al. |
| 5,654,568 A | 8/1997 | Nakao |
| 5,656,513 A | 8/1997 | Wang et al. |
| 5,657,332 A | 8/1997 | Auclair et al. |
| 5,661,060 A | 8/1997 | Gill et al. |
| 5,663,907 A | 9/1997 | Frayer et al. |
| 5,666,365 A | 9/1997 | Kostreski |
| 5,672,959 A | 9/1997 | Der |
| 5,675,280 A | 10/1997 | Nomura |
| 5,677,867 A | 10/1997 | Hazani |
| 5,677,869 A | 10/1997 | Fazio et al. |
| 5,683,925 A | 11/1997 | Irani et al. |
| 5,689,459 A | 11/1997 | Chang et al. |
| 5,694,356 A | 12/1997 | Wong et al. |
| 5,696,929 A | 12/1997 | Hasbun et al. |
| 5,708,608 A | 1/1998 | Park et al. |
| 5,712,814 A | 1/1998 | Fratin et al. |
| 5,712,815 A | 1/1998 | Bill et al. |
| 5,715,193 A | 2/1998 | Norman |
| 5,717,581 A | 2/1998 | Canclini |
| 5,717,632 A | 2/1998 | Richart et al. |
| 5,717,635 A | 2/1998 | Akatsu |
| 5,721,781 A | 2/1998 | Deo et al. |
| 5,726,946 A | 3/1998 | Yamagata et al. |
| 5,745,410 A | 4/1998 | Yiu et al. |
| 5,748,534 A | 5/1998 | Dunlap et al. |
| 5,751,037 A | 5/1998 | Aozasa et al. |
| 5,751,637 A | 5/1998 | Chen et al. |
| 5,754,475 A | 5/1998 | Bill et al. |
| 5,760,445 A | 6/1998 | Diaz |
| 5,760,634 A | 6/1998 | Fu |
| 5,768,192 A | 6/1998 | Eitan |
| 5,768,193 A | 6/1998 | Lee et al. |
| 5,771,197 A | 6/1998 | Kim |
| 5,774,395 A | 6/1998 | Richart et al. |
| 5,777,919 A | 7/1998 | Chi-Yung et al. |
| 5,781,476 A | 7/1998 | Seki et al. |
| 5,781,478 A | 7/1998 | Takeuchi et al. |
| 5,783,934 A | 7/1998 | Tran |
| 5,784,314 A | 7/1998 | Sali et al. |
| 5,787,036 A | 7/1998 | Okazawa |
| 5,793,079 A | 8/1998 | Georgescu et al. |
| 5,801,076 A | 9/1998 | Ghneim et al. |
| 5,805,500 A | 9/1998 | Campardo et al. |
| 5,808,506 A | 9/1998 | Tran |
| 5,812,449 A | 9/1998 | Song |
| 5,812,456 A | 9/1998 | Hull et al. |
| 5,812,457 A | 9/1998 | Arase |
| 5,815,435 A | 9/1998 | Van Tran |
| 5,822,256 A | 10/1998 | Bauer et al. |
| 5,825,683 A | 10/1998 | Chang |
| 5,825,686 A | 10/1998 | Schmitt-Landsiedel et al. |
| 5,828,601 A | 10/1998 | Hollmer et al. |
| 5,834,851 A | 11/1998 | Ikeda et al. |
| 5,835,935 A | 11/1998 | Estakhri et al. |
| 5,836,772 A | 11/1998 | Chang et al. |
| 5,841,700 A | 11/1998 | Chang |
| 5,847,441 A | 12/1998 | Cutter et al. |
| 5,861,771 A | 1/1999 | Matsuda et al. |
| 5,862,076 A | 1/1999 | Eitan |
| 5,864,164 A | 1/1999 | Wen |
| 5,867,429 A | 2/1999 | Chen et al. |
| 5,870,334 A | 2/1999 | Hemink et al. |
| 5,870,335 A | 2/1999 | Khan et al. |
| 5,872,848 A | 2/1999 | Romney et al. |
| 5,875,128 A | 2/1999 | Ishizuka |
| 5,877,537 A | 3/1999 | Aoki |
| 5,880,620 A | 3/1999 | Gitlin et al. |
| 5,886,927 A | 3/1999 | Takeuchi |
| RE36,179 E | 4/1999 | Shimoda |
| 5,892,710 A | 4/1999 | Fazio et al. |
| 5,903,031 A | 5/1999 | Yamada et al. |
| 5,910,924 A | 6/1999 | Tanaka et al. |
| 5,920,503 A | 7/1999 | Lee et al. |
| 5,920,507 A | 7/1999 | Takeuchi et al. |
| 5,926,409 A | 7/1999 | Engh et al. |
| 5,930,195 A | 7/1999 | Komatsu |
| 5,933,366 A | 8/1999 | Yoshikawa |
| 5,933,367 A | 8/1999 | Matsuo et al. |
| 5,936,888 A | 8/1999 | Sugawara |
| 5,940,332 A | 8/1999 | Artieri |
| 5,946,258 A | 8/1999 | Evertt et al. |
| 5,946,558 A | 8/1999 | Hsu |
| 5,949,714 A | 9/1999 | Hemink et al. |
| 5,949,728 A | 9/1999 | Liu et al. |
| 5,959,311 A | 9/1999 | Shih et al. |
| 5,963,412 A | 10/1999 | En |
| 5,963,465 A | 10/1999 | Eitan |
| 5,966,603 A | 10/1999 | Eitan |
| 5,969,989 A | 10/1999 | Iwahashi |
| 5,969,993 A | 10/1999 | Takeshima |
| 5,973,373 A | 10/1999 | Krautschneider et al. |
| 5,982,666 A | 11/1999 | Campardo |
| 5,986,940 A | 11/1999 | Atsumi et al. |
| 5,990,526 A | 11/1999 | Bez et al. |
| 5,991,201 A | 11/1999 | Kuo et al. |
| 5,991,202 A | 11/1999 | Derhacobian et al. |
| 5,991,517 A | 11/1999 | Harari et al. |
| 5,999,444 A | 12/1999 | Fujiwara et al. |
| 5,999,494 A | 12/1999 | Holzrichter |
| 6,000,006 A | 12/1999 | Bruce et al. |
| 6,005,423 A | 12/1999 | Schultz |
| 6,011,715 A | 1/2000 | Pasotti |
| 6,011,725 A | 1/2000 | Eitan |
| 6,018,186 A | 1/2000 | Hsu |
| 6,020,241 A | 2/2000 | You et al. |
| 6,028,324 A | 2/2000 | Su et al. |
| 6,030,871 A | 2/2000 | Eitan |
| 6,034,403 A | 3/2000 | Wu |
| 6,034,896 A | 3/2000 | Ranaweera et al. |
| 6,037,627 A | 3/2000 | Kitamura et al. |
| 6,040,610 A | 3/2000 | Noguchi et al. |
| 6,040,996 A | 3/2000 | Kong |
| 6,044,019 A | 3/2000 | Cernea et al. |
| 6,044,022 A | 3/2000 | Nachumovsky |
| 6,063,666 A | 5/2000 | Chang et al. |
| 6,064,226 A | 5/2000 | Earl |
| 6,064,251 A | 5/2000 | Park |
| 6,064,591 A | 5/2000 | Takeuchi et al. |
| 6,074,916 A | 6/2000 | Cappelletti |
| 6,075,402 A | 6/2000 | Ghilardelli |
| 6,075,724 A | 6/2000 | Li et al. |
| 6,078,518 A | 6/2000 | Chevallier |
| 6,081,456 A | 6/2000 | Dadashev |
| 6,084,794 A | 7/2000 | Lu et al. |
| 6,091,640 A | 7/2000 | Kawahara et al. |
| 6,094,095 A | 7/2000 | Murray et al. |
| 6,097,639 A | 8/2000 | Choi et al. |
| 6,107,862 A | 8/2000 | Mukainakano et al. |
| 6,108,240 A | 8/2000 | Lavi et al. |
| 6,108,241 A | 8/2000 | Chevallier |
| 6,117,714 A | 9/2000 | Beatty |
| 6,118,207 A | 9/2000 | Ormerod et al. |
| 6,118,692 A | 9/2000 | Banks |
| 6,122,198 A | 9/2000 | Haddad et al. |
| 6,128,226 A | 10/2000 | Eitan et al. |
| 6,128,227 A | 10/2000 | Kim |
| 6,130,452 A | 10/2000 | Lu et al. |
| 6,130,572 A | 10/2000 | Ghilardelli et al. |

| Patent | Date | Inventor |
|---|---|---|
| 6,130,574 A | 10/2000 | Bloch et al. |
| 6,133,095 A | 10/2000 | Eitan et al. |
| 6,134,156 A | 10/2000 | Eitan |
| 6,137,718 A | 10/2000 | Reisinger |
| 6,147,904 A | 11/2000 | Liron |
| 6,147,906 A | 11/2000 | Bill et al. |
| 6,148,435 A | 11/2000 | Bettman |
| 6,150,800 A | 11/2000 | Kinoshita et al. |
| 6,154,081 A | 11/2000 | Pakkala et al. |
| 6,156,149 A | 12/2000 | Cheung et al. |
| 6,157,242 A | 12/2000 | Fukui |
| 6,157,570 A | 12/2000 | Nachumovsky |
| 6,163,048 A | 12/2000 | Hirose et al. |
| 6,163,484 A | 12/2000 | Uekubo |
| 6,169,691 B1 | 1/2001 | Pasotti et al. |
| 6,175,519 B1 | 1/2001 | Lu et al. |
| 6,175,523 B1 | 1/2001 | Yang et al. |
| 6,181,597 B1 | 1/2001 | Nachumovsky |
| 6,181,605 B1 | 1/2001 | Hollmer et al. |
| 6,185,143 B1 | 2/2001 | Perner et al. |
| 6,188,211 B1 | 2/2001 | Rincon-Mora et al. |
| 6,190,966 B1 | 2/2001 | Ngo et al. |
| 6,192,445 B1 | 2/2001 | Rezvani |
| 6,195,196 B1 | 2/2001 | Kimura et al. |
| 6,198,342 B1 | 3/2001 | Kawai |
| 6,201,282 B1 | 3/2001 | Eitan |
| 6,201,737 B1 | 3/2001 | Hollmer et al. |
| 6,205,055 B1 | 3/2001 | Parker |
| 6,205,056 B1 | 3/2001 | Pan et al. |
| 6,205,059 B1 | 3/2001 | Gutala et al. |
| 6,208,200 B1 | 3/2001 | Arakawa |
| 6,208,557 B1 | 3/2001 | Bergemont et al. |
| 6,214,666 B1 | 4/2001 | Mehta |
| 6,215,148 B1 | 4/2001 | Eitan |
| 6,215,697 B1 | 4/2001 | Lu et al. |
| 6,215,702 B1 | 4/2001 | Derhacobian et al. |
| 6,218,695 B1 | 4/2001 | Nachumovsky |
| 6,219,277 B1 | 4/2001 | Devin et al. |
| 6,219,290 B1 | 4/2001 | Chang et al. |
| 6,222,762 B1 | 4/2001 | Guterman et al. |
| 6,222,768 B1 | 4/2001 | Hollmer et al. |
| 6,233,180 B1 | 5/2001 | Eitan et al. |
| 6,240,032 B1 | 5/2001 | Fukumoto |
| 6,240,040 B1 | 5/2001 | Akaogi et al. |
| 6,246,555 B1 | 6/2001 | Tham |
| 6,252,442 B1 | 6/2001 | Malherbe |
| 6,252,799 B1 | 6/2001 | Liu et al. |
| 6,256,231 B1 | 7/2001 | Lavi et al. |
| 6,261,904 B1 | 7/2001 | Pham et al. |
| 6,265,268 B1 | 7/2001 | Halliyal et al. |
| 6,266,281 B1 | 7/2001 | Derhacobian et al. |
| 6,272,047 B1 | 8/2001 | Mihnea et al. |
| 6,275,414 B1 | 8/2001 | Randolph et al. |
| 6,281,545 B1 | 8/2001 | Liang et al. |
| 6,282,133 B1 | 8/2001 | Nakagawa et al. |
| 6,282,145 B1 | 8/2001 | Tran et al. |
| 6,285,246 B1 | 9/2001 | Basu |
| 6,285,574 B1 | 9/2001 | Eitan |
| 6,285,589 B1 | 9/2001 | Kajitani |
| 6,285,614 B1 | 9/2001 | Mulatti et al. |
| 6,292,394 B1 | 9/2001 | Cohen et al. |
| 6,297,096 B1 | 10/2001 | Boaz |
| 6,297,974 B1 | 10/2001 | Ganesan et al. |
| 6,304,485 B1 | 10/2001 | Harari et al. |
| 6,307,784 B1 | 10/2001 | Hamilton et al. |
| 6,307,807 B1 | 10/2001 | Sakui et al. |
| 6,308,485 B1 | 10/2001 | Harari et al. |
| 6,320,786 B1 | 11/2001 | Chang et al. |
| 6,324,094 B1 | 11/2001 | Chevallier |
| 6,326,265 B1 | 12/2001 | Liu et al. |
| 6,330,192 B1 | 12/2001 | Ohba et al. |
| 6,331,950 B1 | 12/2001 | Kuo et al. |
| 6,335,874 B1 | 1/2002 | Eitan |
| 6,335,990 B1 | 1/2002 | Chen et al. |
| 6,337,502 B1 | 1/2002 | Eitan et al. |
| 6,339,556 B1 | 1/2002 | Watanabe |
| 6,343,033 B1 | 1/2002 | Parker |
| 6,344,959 B1 | 2/2002 | Milazzo |
| 6,346,442 B1 | 2/2002 | Aloni et al. |
| 6,348,381 B1 | 2/2002 | Jong |
| 6,348,711 B1 | 2/2002 | Eitan |
| 6,351,415 B1 | 2/2002 | Kushnarenko |
| 6,353,356 B1 | 3/2002 | Liu |
| 6,353,554 B1 | 3/2002 | Banks |
| 6,353,555 B1 | 3/2002 | Jeong |
| 6,356,062 B1 | 3/2002 | Elmhurst et al. |
| 6,356,469 B1 | 3/2002 | Roohparvar et al. |
| 6,359,501 B2 | 3/2002 | Lin et al. |
| 6,374,337 B1 | 4/2002 | Estakhri |
| 6,385,086 B1 | 5/2002 | Mihara et al. |
| 6,396,741 B1 | 5/2002 | Bloom et al. |
| 6,400,209 B1 | 6/2002 | Matsuyama et al. |
| 6,400,607 B1 | 6/2002 | Pasotti et al. |
| 6,407,537 B2 | 6/2002 | Antheunis |
| 6,410,388 B1 | 6/2002 | Kluth et al. |
| 6,417,081 B1 | 7/2002 | Thurgate |
| 6,418,506 B1 | 7/2002 | Pashley et al. |
| 6,426,898 B1 | 7/2002 | Mihnea et al. |
| 6,429,063 B1 | 8/2002 | Eitan |
| 6,433,624 B1 | 8/2002 | Grossnikle et al. |
| 6,436,766 B1 | 8/2002 | Rangarajan et al. |
| 6,436,768 B1 | 8/2002 | Yang et al. |
| 6,438,031 B1 | 8/2002 | Fastow |
| 6,438,035 B2 | 8/2002 | Yamamoto et al. |
| 6,440,797 B1 | 8/2002 | Wu et al. |
| 6,442,074 B1 | 8/2002 | Hamilton et al. |
| 6,445,030 B1 | 9/2002 | Wu et al. |
| 6,448,750 B1 | 9/2002 | Shor et al. |
| 6,449,188 B1 | 9/2002 | Fastow |
| 6,449,190 B1 | 9/2002 | Bill |
| 6,452,438 B1 | 9/2002 | Li |
| 6,455,896 B1 | 9/2002 | Chou et al. |
| 6,456,528 B1 | 9/2002 | Chen |
| 6,456,533 B1 | 9/2002 | Hamilton et al. |
| 6,456,539 B1 | 9/2002 | Nguyen et al. |
| 6,458,656 B1 | 10/2002 | Park et al. |
| 6,458,677 B1 | 10/2002 | Hopper et al. |
| 6,469,929 B1 | 10/2002 | Kushnarenko et al. |
| 6,469,935 B2 | 10/2002 | Hayashi |
| 6,472,706 B2 | 10/2002 | Widdershoven et al. |
| 6,477,084 B1 | 11/2002 | Eitan |
| 6,477,085 B1 | 11/2002 | Kuo |
| 6,490,204 B2 | 12/2002 | Bloom et al. |
| 6,496,414 B2 | 12/2002 | Kasa et al. |
| 6,504,756 B2 | 1/2003 | Gonzalez et al. |
| 6,510,082 B1 | 1/2003 | Le et al. |
| 6,512,701 B1 | 1/2003 | Hamilton et al. |
| 6,519,180 B2 | 2/2003 | Tran et al. |
| 6,519,182 B1 | 2/2003 | Derhacobian et al. |
| 6,522,585 B2 | 2/2003 | Pasternak |
| 6,525,969 B1 | 2/2003 | Kurihara et al. |
| 6,528,390 B2 | 3/2003 | Komori et al. |
| 6,529,412 B1 | 3/2003 | Chen et al. |
| 6,532,173 B2 | 3/2003 | Lioka et al. |
| 6,535,020 B1 | 3/2003 | Yin |
| 6,535,434 B2 | 3/2003 | Maayan et al. |
| 6,537,881 B1 | 3/2003 | Rangarjan et al. |
| 6,538,270 B1 | 3/2003 | Randolph et al. |
| 6,541,816 B2 | 4/2003 | Ramsbey et al. |
| 6,552,387 B1 | 4/2003 | Eitan |
| 6,555,436 B2 | 4/2003 | Ramsbey et al. |
| 6,559,500 B2 | 5/2003 | Torii |
| 6,562,683 B1 | 5/2003 | Wang et al. |
| 6,566,194 B1 | 5/2003 | Ramsbey et al. |
| 6,566,699 B2 | 5/2003 | Eitan |
| 6,567,303 B1 | 5/2003 | Hamilton et al. |

| | | | | | | |
|---|---|---|---|---|---|---|
| 6,567,312 B1 | 5/2003 | Torii et al. | | 6,818,956 B2 | 11/2004 | Kuo et al. |
| 6,567,316 B1 | 5/2003 | Ohba et al. | | 6,829,172 B2 | 12/2004 | Bloom et al. |
| 6,574,139 B2 | 6/2003 | Kurihara | | 6,831,872 B2 | 12/2004 | Matsuoka |
| 6,577,514 B2 | 6/2003 | Shor et al. | | 6,836,431 B2 | 12/2004 | Chang |
| 6,577,532 B1 | 6/2003 | Chevallier | | 6,839,280 B1 | 1/2005 | Chindalore et al. |
| 6,577,547 B2 | 6/2003 | Ukon | | 6,859,028 B2 | 2/2005 | Toner |
| 6,583,005 B2 | 6/2003 | Hashimoto et al. | | 6,870,772 B1 | 3/2005 | Nitta et al. |
| 6,583,007 B1 | 6/2003 | Eitan | | 6,871,258 B2 | 3/2005 | Micheloni et al. |
| 6,583,479 B1 | 6/2003 | Fastow et al. | | 6,885,585 B2 | 4/2005 | Maayan et al. |
| 6,584,017 B2 | 6/2003 | Maayan et al. | | 6,885,590 B1 | 4/2005 | Zheng et al. |
| 6,590,811 B1 | 7/2003 | Hamilton et al. | | 6,906,357 B1 | 6/2005 | Vashchenko et al. |
| 6,593,606 B1 | 7/2003 | Randolph et al. | | 6,912,160 B2 | 6/2005 | Yamada |
| 6,594,181 B1 | 7/2003 | Yamada | | 6,917,541 B2 | 7/2005 | Shimbayashi et al. |
| 6,608,526 B1 | 8/2003 | Sauer | | 6,917,544 B2 | 7/2005 | Maayan et al. |
| 6,608,905 B1 | 8/2003 | Muza et al. | | 6,928,001 B2 | 8/2005 | Avni et al. |
| 6,614,052 B1 | 9/2003 | Zhang | | 6,930,928 B2 | 8/2005 | Liu et al. |
| 6,614,295 B2 | 9/2003 | Tsuchi | | 6,937,521 B2 | 8/2005 | Avni |
| 6,614,686 B1 | 9/2003 | Kawamura | | 6,937,523 B2 | 8/2005 | Eshel |
| 6,614,690 B2 | 9/2003 | Roohparvar | | 6,954,393 B2 | 10/2005 | Lusky et al. |
| 6,614,692 B2 | 9/2003 | Maayan et al. | | 6,967,872 B2 | 11/2005 | Quader et al. |
| 6,617,179 B1 | 9/2003 | Kim | | 6,967,896 B2 | 11/2005 | Eisen et al. |
| 6,617,215 B1 | 9/2003 | Halliyal et al. | | 6,977,410 B2 | 12/2005 | Naso et al. |
| 6,618,290 B1 | 9/2003 | Wang et al. | | 6,981,188 B2 | 12/2005 | Galzur et al. |
| 6,624,672 B2 | 9/2003 | Confaloneri et al. | | 6,996,692 B2 | 2/2006 | Kuono |
| 6,627,555 B2 | 9/2003 | Eitan et al. | | 7,043,672 B2 | 5/2006 | Merritt |
| 6,630,384 B1 | 10/2003 | Sun et al. | | 7,079,420 B2 | 7/2006 | Shappir et al. |
| 6,633,496 B2 | 10/2003 | Maayan et al. | | 7,116,577 B2 | 10/2006 | Eitan |
| 6,633,499 B1 | 10/2003 | Eitan et al. | | 7,125,763 B1 | 10/2006 | Sobek et al. |
| 6,633,956 B1 | 10/2003 | Mitani | | 2001/0006477 A1 | 7/2001 | Banks |
| 6,636,440 B2 | 10/2003 | Maayan et al. | | 2002/0004878 A1 | 1/2002 | Norman |
| 6,639,271 B1 | 10/2003 | Zheng et al. | | 2002/0004921 A1 | 1/2002 | Muranaka et al. |
| 6,639,837 B2 | 10/2003 | Takano et al. | | 2002/0064911 A1 | 5/2002 | Eitan |
| 6,639,844 B1 | 10/2003 | Liu et al. | | 2002/0101765 A1 | 8/2002 | Mihnea et al. |
| 6,639,849 B2 | 10/2003 | Takahashi et al. | | 2002/0132436 A1 | 9/2002 | Eliyahu et al. |
| 6,642,148 B1 | 11/2003 | Ghandehari et al. | | 2002/0140109 A1 | 10/2002 | Keshavarzi et al. |
| 6,642,573 B1 | 11/2003 | Halliyal et al. | | 2002/0145465 A1 | 10/2002 | Shor et al. |
| 6,642,586 B2 | 11/2003 | Takahashi | | 2002/0191465 A1 | 12/2002 | Maayan et al. |
| 6,643,169 B2 * | 11/2003 | Rudelic et al. ......... 365/185.03 | | 2002/0199065 A1 | 12/2002 | Subramoney et al. |
| 6,643,170 B2 | 11/2003 | Huang et al. | | 2003/0001213 A1 | 1/2003 | Lai |
| 6,643,177 B1 | 11/2003 | Le et al. | | 2003/0021155 A1 | 1/2003 | Yachareni et al. |
| 6,643,178 B2 | 11/2003 | Kurihara | | 2003/0072192 A1 | 4/2003 | Bloom et al. |
| 6,643,181 B2 | 11/2003 | Sofer et al. | | 2003/0076710 A1 | 4/2003 | Sofer et al. |
| 6,645,801 B1 | 11/2003 | Ramsbey et al. | | 2003/0100153 A1 | 5/2003 | Kunori |
| 6,649,972 B2 | 11/2003 | Eitan | | 2003/0117841 A1 | 6/2003 | Yamashita |
| 6,650,568 B2 | 11/2003 | Iijima | | 2003/0131186 A1 | 7/2003 | Buhr |
| 6,653,190 B1 | 11/2003 | Yang et al. | | 2003/0134476 A1 | 7/2003 | Roizin et al. |
| 6,653,191 B1 | 11/2003 | Yang et al. | | 2003/0142544 A1 | 7/2003 | Maayan et al. |
| 6,654,296 B2 | 11/2003 | Jang et al. | | 2003/0145176 A1 | 7/2003 | Dvir et al. |
| 6,664,588 B2 | 12/2003 | Eitan | | 2003/0145188 A1 | 7/2003 | Cohen et al. |
| 6,665,769 B2 | 12/2003 | Cohen et al. | | 2003/0155659 A1 | 8/2003 | Verma et al. |
| 6,670,241 B1 | 12/2003 | Kamal et al. | | 2003/0190786 A1 | 10/2003 | Ramsbey et al. |
| 6,670,669 B1 | 12/2003 | Kawamura | | 2003/0197221 A1 | 10/2003 | Shinozaki et al. |
| 6,674,138 B1 | 1/2004 | Halliyal et al. | | 2003/0202411 A1 | 10/2003 | Yamada |
| 6,677,805 B2 | 1/2004 | Shor et al. | | 2003/0206435 A1 | 11/2003 | Takahashi |
| 6,680,509 B1 | 1/2004 | Wu et al. | | 2003/0208663 A1 | 11/2003 | Van Buskirk et al. |
| 6,686,242 B2 | 2/2004 | Willer et al. | | 2003/0209767 A1 | 11/2003 | Takahashi et al. |
| 6,690,602 B1 | 2/2004 | Le et al. | | 2003/0214844 A1 | 11/2003 | Iijima |
| 6,693,483 B2 | 2/2004 | Deml et al. | | 2003/0214852 A1 | 11/2003 | Chang |
| 6,700,818 B2 | 3/2004 | Shappir et al. | | 2003/0218207 A1 | 11/2003 | Hashimoto et al. |
| 6,714,457 B1 * | 3/2004 | Hsu et al. ............... 365/185.28 | | 2003/0218913 A1 | 11/2003 | Le et al. |
| 6,717,207 B2 | 4/2004 | Kato | | 2003/0222303 A1 | 12/2003 | Fukuda et al. |
| 6,723,518 B2 | 4/2004 | Papsidero et al. | | 2003/0227796 A1 | 12/2003 | Miki et al. |
| 6,731,542 B1 | 5/2004 | Le et al. | | 2004/0007730 A1 | 1/2004 | Chou et al. |
| 6,738,289 B2 | 5/2004 | Gongwer et al. | | 2004/0012993 A1 | 1/2004 | Kurihara |
| 6,744,692 B2 | 6/2004 | Shiota et al. | | 2004/0013000 A1 | 1/2004 | Torii |
| 6,765,259 B2 | 7/2004 | Kim | | 2004/0014280 A1 | 1/2004 | Willer et al. |
| 6,768,165 B1 | 7/2004 | Eitan | | 2004/0014290 A1 | 1/2004 | Yang et al. |
| 6,781,876 B2 | 8/2004 | Forbes et al. | | 2004/0017717 A1 | 1/2004 | Morishima |
| 6,788,579 B2 | 9/2004 | Gregori et al. | | 2004/0021172 A1 | 2/2004 | Zheng et al. |
| 6,791,396 B2 | 9/2004 | Shor et al. | | 2004/0027858 A1 | 2/2004 | Takahashi et al. |
| 6,794,249 B2 | 9/2004 | Palm et al. | | 2004/0117395 A1 | 6/2004 | Gong et al. |
| 6,794,280 B2 | 9/2004 | Chang | | 2004/0136236 A1 | 7/2004 | Cohen |
| 6,798,699 B2 | 9/2004 | Mihnea et al. | | 2004/0151034 A1 | 8/2004 | Shor et al. |

| | | | |
|---|---|---|---|
| 2004/0153621 A1 | 8/2004 | Polansky et al. | |
| 2004/0157393 A1 | 8/2004 | Hwang | |
| 2004/0222437 A1 | 11/2004 | Avni et al. | |
| 2005/0058005 A1 | 3/2005 | Shappir et al. | |
| 2005/0078026 A1 | 4/2005 | Cai | |
| 2005/0078528 A1 | 4/2005 | Tsang et al. | |
| 2005/0117395 A1 | 6/2005 | Maayan et al. | |
| 2005/0117601 A1 | 6/2005 | Anderson et al. | |
| 2005/0140405 A1 | 6/2005 | Do et al. | |
| 2005/0213593 A1 | 9/2005 | Anderson et al. | |
| 2005/0232024 A1 | 10/2005 | Atir et al. | |
| 2006/0015691 A1 | 1/2006 | Louie et al. | |
| 2006/0084219 A1 | 4/2006 | Lusky et al. | |
| 2006/0126382 A1 | 6/2006 | Maayan et al. | |
| 2006/0126983 A1 | 6/2006 | Shappir et al. | |

FOREIGN PATENT DOCUMENTS

| | | |
|---|---|---|
| EP | 0751560 | 6/1995 |
| EP | 0693781 | 1/1996 |
| EP | 0 822 557 | 2/1998 |
| EP | 0 843 398 | 5/1998 |
| EP | 0580467 | 9/1998 |
| EP | 0461764 | 7/2000 |
| EP | 1 071 096 | 1/2001 |
| EP | 1073120 | 1/2001 |
| EP | 1 091 418 | 4/2001 |
| EP | 1126468 | 8/2001 |
| EP | 0740307 | 12/2001 |
| EP | 1164597 | 12/2001 |
| EP | 1 207 552 | 5/2002 |
| EP | 1 223 586 | 7/2002 |
| EP | 1324343 | 7/2003 |
| EP | 1 365 452 | 11/2003 |
| EP | 001217744 | 3/2004 |
| GB | 1297899 | 11/1972 |
| GB | 2157489 | 3/1985 |
| JP | 54-053929 | 4/1979 |
| JP | 54125938 | 9/1979 |
| JP | 58094199 U | 6/1983 |
| JP | 60-200566 | 10/1985 |
| JP | 60201594 | 10/1985 |
| JP | 63-249375 | 10/1988 |
| JP | 3-285358 | 12/1991 |
| JP | 04-226071 | 8/1992 |
| JP | 04-291962 | 10/1992 |
| JP | 05021758 | 1/1993 |
| JP | 05-326893 | 12/1993 |
| JP | 06151833 | 5/1994 |
| JP | 06-232416 | 8/1994 |
| JP | 07193151 | 7/1995 |
| JP | 08-106791 | 4/1996 |
| JP | 08-297988 | 11/1996 |
| JP | 09-017981 | 1/1997 |
| JP | 09162314 | 6/1997 |
| JP | 10-055691 | 2/1998 |
| JP | 10-106276 | 4/1998 |
| JP | 10-199263 | 7/1998 |
| JP | 10-228784 | 8/1998 |
| JP | 10-228786 | 8/1998 |
| JP | 10 334676 | 12/1998 |
| JP | 11-162182 | 6/1999 |
| JP | 11-219593 | 8/1999 |
| JP | 11-354758 | 12/1999 |
| JP | 2000-315392 | 11/2000 |
| JP | 2001-085646 | 3/2001 |
| JP | 2001-118392 | 4/2001 |
| JP | 2001-156189 | 6/2001 |
| JP | 2002-216488 | 8/2002 |
| JP | 3358663 | 10/2002 |
| WO | WO 81/00790 | 3/1981 |
| WO | WO 96/15553 | 5/1996 |
| WO | WO 96/25741 | 8/1996 |
| WO | WO 98/03977 | 1/1998 |
| WO | WO 99/31670 | 6/1999 |
| WO | WO 99/57728 | 11/1999 |
| WO | WO 00/46808 | 8/2000 |
| WO | WO 01/65566 | 9/2001 |
| WO | WO 01/65567 | 9/2001 |
| WO | WO 01/84552 | 11/2001 |
| WO | WO 02/43073 | 5/2002 |
| WO | WO 03/032393 | 4/2003 |
| WO | WO 03/036651 | 5/2003 |
| WO | WO 03/054964 | 7/2003 |
| WO | WO 03/063167 | 7/2003 |
| WO | WO 03/063168 | 7/2003 |
| WO | WO 03/079370 | 9/2003 |
| WO | WO 03/079446 | 9/2003 |
| WO | WO 03/083916 | 10/2003 |
| WO | WO 03/088258 | 10/2003 |
| WO | WO 03/088259 | 10/2003 |
| WO | WO 03/088260 | 10/2003 |
| WO | WO 03/088261 | 10/2003 |
| WO | WO 03/088353 | 10/2003 |
| WO | WO 03/100790 | 12/2003 |

OTHER PUBLICATIONS

U.S. Appl. No. 11/489,327, filed Jul. 18, 2006, Eitan et al.
U.S. Appl. No. 11/440,624, filed May 24, 2006, Lusky et al.
U.S. Appl. No. 11/489,747, filed Jul. 18, 2006, Bloom et al.
U.S. Appl. No. 11/336,093, filed Jan. 20, 2006, Eitan et al.
Bude et al., EEPROM/Flash Sub 3.0V drain—Source Bias Hot Carrier Writing, IEDM, 1995, pp. 989-992.
Bude et al., Secondary Electron Flash—a High Performance, Low Power Flash Technology for 0.35 um and below, IDEM, 1997, 279-282.
Bude et al., Modeling Nonequilibrium Hot Carrier Device Effects, Conference of Insulator Specialists of Europe, Jun. 1997, Sweden.
Jung et al., IEEE Journal of Solid-State Circuits, Nov. 1996, 1575-1583, vol. 31, No. 11.
Campardo et al., IEEE Journal of Solid-State Circuits, Nov. 2000, 1655-1667, vol. 35, No. 11.
Lin et al., Novel Source-Controlled Self-Verified Programming for Multilevel EEPROM's, IEEE Transactions on Electron Devices, Jun. 2000, 1166-1174, vol. 47, No. 6.
Chan et al., A True Single-Transistor Oxide-Nitride-Oxide EEPROM Device, IEEE Electron Device Letters, Mar. 1987, vol. EDL-8, No. 3.
Eitan et al., "Hot-Electron Injection into the Oxide in n-Channel MOS Devices", IEEE Transactions on Electron Devices, vol. ED-28, No. 3, pp. 328-370, Mar. 1981.
Roy Anirban, "Characterization and Modeling of Charge Trapping and Retention in Novel Multi-Dielectric Nonvolatile Semiconductor Memory Devices", Microelectronics Laboratory, Sherman Fairchild Center, Department of Computer Science and Electrical Engineering, Bethlehem, Pennsylvania, p. 1-35, 1989.
Tanaka et al., "A Quick Intelligent Page-Programming Architecture and a Shielded Bitline Sensing Method for 3 V-Only NAND Flash Memory", IEEE Journal of Solid-State Circuits, vol. 29, No. 11, Nov. 1994, pp. 1366-1373.
Ma et al., A Dual-bit Split-Gate EEPROM (DSG) Cell in Contactless Array for Single-Vcc High Density Flash Memories, IEEE, 1994, 57-60.
Oshima et al., Process and Device Technologies for 16Mbit EPROMs with Large-Tilt-Angle Implanted P-Pocket Cell, IEEE, Dec. 1990, Ch. 2865-8/90/0000-0095, pp. 5 2 1-5 2 4, San Francisco, California.
Lee, A new approach for the floating-gate MOS nonvolatile memory, Applied Physics Letters, Oct. 1977, 475-476, vol. 31, No. 7, American Institute of Physics.
Glasser et al., MOS Device Electronics, The Design and Analysis of VLSI Circuits, Chapter 2, 67-163, 1998, Addison-Wesley Publishing Company.
Bhattacharyya et al., FET Gate Structure for Nonvolatile N-Channel Read-Mostly Memory Device, IBM Technical Disclosure Bulletin, Nov. 1975, 1768, vol. 18, No. 6.

Ricco et al.; Nonvolatile Multilevel Memories for Digital Applications, Dec. 1998, 2399-2421, vol. 86, No. 12, Institute of Electrical and Electronics Engineers, Inc.

Martin, Improved Circuits for the Realization of Switched-Capacitor Filters, IEEE Transactions on Circuits and Systems, Apr. 1980, 237-244, vol. CAS-27.

Tseng et al., "Thin CVD Stacked Gate Dielectric for ULSI Technology", IEEE, pp. 321-214; 1993, 13.1.1-13.1.4.

Pickar, Ion Implantation in Silicon—Physics, Processing, and Microelectronic Devices, Applied Solid State Science, 1975, 151-241, vol. 5, Academic Press.

2 Bit/Cell EEPROM Cell Using Band-To-Band Tunneling for Data Read-Out, IBM Technical Disclosure Bulletin, 1992, 136-140, vol. 35 No. 4B.

Umezawa, et al., A 5-V-Only Operation 0.6-µm Flash EEPROM with Row Decoder Scheme in Triple-Well Structure, IEEE Journal of Solid-State Circuits, 1992, 1540, vol. 27.

Mitchell, et al., A new self-aligned planar array cell for ultra high density EPROMS, 1987.

Esquivel, et al., High Density Contactless, Self Aligned EPROM Cell Array Technology, 1986.

Johns, Martin, Analog Integrated Circuit Design, Jun. 1, 1997, Chapter 10, John Wiley and Sons Inc.

Allen, et al., CMOS Analog Circuit Design, 2002, 259pages, Oxford University Press.

Klinke, et al., A very-high-slew-rate CMOS operational amplifier, IEEE Journal of Solid-State Circuits, 1989, 744-746, 24 vol.

Shor, et al, paper WA2.04.01—Self regulated Four phased charge pump with boosted wells, ISCAS 2002.

Fotouhi, An efficient CMOS line driver for 1.544-Mb/s T1 and 2.048-Mb/s El applications, IEEE Journal of Solid-State Circuits, 2003, 226-236pages, 38vol.

P-N Junction Diode, Physics of semiconductor devices, 1981, ch. 2, "A Wiley-Interscience Publication", John Wiley & Sons Publishers.

Chang, Non Volatile Semiconductor Memory Devices, Proceedings of the IEEE, 64 vol., No. 7 , pp. 1039-1059; Jul. 1976.

Yoon, Sukyoon, et al., A Novel Substrate Hot Electron and Hole Injection Structure with a double-implanted buried-channel MOSFET, IEEE Transactions on Electron Devices, Dec. 1991, p. 2722, vol. 38, No. 12 .

4 Bits of Digital Data Fit in a Single Cell, Technology Newsletter, Electronic Design, Apr. 1, 1996.

M. Specht et al, Novel Dual Bit Tri- Gate Charge Trapping Memory Devices, IEEE Electron Device Letters, vol. 25, No. 12, Dec. 2004, pp. 810-812.

"Design Considerations in Scaled SONOS Nonvolatile Memory Devices" Bu, Jiankang et al. , Lehigh University, Bethlehem, PA, Power Point Presentation, pp. 1-24, 2000; http://klabs.org/richcontent/MemoryContent/nvmt_symp/nvmts_2000/presentations/bu_white_sonos_lehigh_univ.pdf.

"SONOS Nonvolatile Semiconductor Memories for Space and Military Applications", Adams et al., Symposium, 2000. http://klabs.org/richcontent/MemoryContent/nvmt_symp/nvmts_2000/papers/adams_d.pdf.

"Philips Research—Technologies—Embedded Nonvolatile Memories" http://research.philips.com/technologies/ics/nvmemories/index.html.

"Semiconductor Memory: Non-Volatile Memory (NVM)", National University of Singapore, Department of Electrical and Computer Engineering: http://ece.nus.edu.sg/stfpage/elezhucx/myweb/NVM.pdf.

"Saifun Non-Volatile Memory Technology", 1st Edition, 2005, published and written by Saifun Semiconductors Ltd. 1110 pgs.

European Search Report 06100524.5, May 16, 2006.

European Search Report 06100507.0, Mar. 28, 2007.

European Search Report 04791843.8, Feb. 13, 2007.

Lee et al., Scalable 2-bit silicon-oxide-nitride-oxide-silicon (SONOS) memory with physically separated local nitrides under a merged gate, Solid State Electronics 48 (2004), pp. 1771-1775.

Mahapatra et al. , CHISEL Flash EEPROM—Part I: Performance and Scaling; IEEE Transactions on Electron Devices, vol. 49. No. 7, Jul. 2002.

Mohapatra et al., CHISEL Programming Operation of Scaled NOR Flash EEPROMs—Effect of Voltage Scaling, Device Scaling and Technological Parameters IEEE Transactions on Electron Devices, vol. 50. No. 10, Oct. 2003.

* cited by examiner

MEMORY ARRAY PROGRAMMING CIRCUIT AND A METHOD FOR USING THE CIRCUIT

CROSS-REFERENCE TO RELATED APPLICATIONS

The present application is a Continuation of U.S. application Ser. No. 10/653,388, which was filed in the U.S. Patent and Trademark Office on Sep. 3, 2003 now U.S. Pat. No. 7,178,004, which claims the benefit of U.S. Provisional Application 60/443,871 filed Jan. 31, 2003, the disclosure of which is incorporated herein by reference.

FIELD OF THE INVENTION

The present invention generally relates to the field of non-volatile memory ("NVM") cells. More specifically, the present invention relates to a method and a system for using a programming register for the programming of multi-level memory cells ("MLC").

BACKGROUND OF THE INVENTION

Non-volatile memory ("NVM") cells may come in a large variety of structures, including but not limited to Poly-silicon floating gate and Nitride Read Only Memory ("NROM"). NVM cells are generally operated (e.g. programmed, read, and erased) using one or more reference cells. Each of the one or more reference cells may be compared against a memory cell being operated in order to determine a condition or state of the memory cell being operated. As is well known, an NVM cell's state may be defined and determined by its threshold voltage, the gate to source voltage at which the cell begins to significantly conduct current. Different threshold voltage ranges are associated with different states, and a NVM cell's threshold voltage level is correlated to the amount of charge stored in a charge storage region of the cell.

Generally, in order to determine whether an NVM cell is at a specific state, for example erased, programmed, or programmed at one of multiple possible program states within a multi-level cell ("MLC"), the cell's threshold level is compared to that of a reference cell whose threshold level is preset at a voltage level associated with the specific state being tested for. Comparing the threshold voltage of an NVM cell to that of a reference cell is often accomplished using a sense amplifier. Various techniques for comparing an NVM's threshold voltage against those of one or more reference cells, in order to determine the state(s) of the NVM's cells, are well known.

When programming an NVM cell to a desired state, after each programming pulse, the NVM cell's threshold voltage may be compared against a reference cell having a reference threshold voltage set at a voltage level defined as the "program verify" level for the given program state. The reference cell with a threshold voltage set at a voltage level defined as a "program verify" level for the given state may be compared to the threshold voltage of the cell being programmed (also referred to as being charged) in order to determine whether a charge storage area or region of the cell being programmed has been sufficiently charged so as to be considered "programmed" at the desired state.

If after a programming pulse has been applied to a cell, it has been determined that a cell has not been sufficiently charged in order for its threshold voltage to be at or above a "program verify" level (i.e. the threshold voltage of the relevant reference cell) associated with the target program state, the cell is typically hit with another programming pulse to try to inject more charge into its charge storage region. Once a cell's threshold value reaches or exceeds the "program verify" level to which it is being programmed, no further programming pulse should be applied to the cell.

Typically, a group of cells in an MLC array are programmed at the same time. Sometimes all the cells of a set being programmed are being programmed to the same program state, in other cases, a portion of the set being programmed is programmed to one program state while another portion of the set is programmed to a second state.

Since not all cells have the same susceptibility to being programmed, cells may not program at the same rate. Some cells reach a target program state before other cells in the same set of cells that are being programmed together. As a cell reaches a target program state, the cell may be masked and may not receive any more programming pulses. Thus, in subsequent programming cycles, only cells which have not reached their target programming state, may continue to receive programming pulses until each cell has reached its respective target program state. Algorithms for programming MLC cells are known. U.S. patent application Ser. No. 10/354,050, filed on Jan. 30, 2003, assigned to the same assignee as the present invention, teaches several programming algorithms for MLC memory arrays. The specification of U.S. patent application Ser. No. 10/354,050, is hereby incorporated by reference in its entirety into the present application. Any programming algorithm, presently known or to be devised in the future, is applicable to the present invention.

There is a need in the field of semiconductors for improved systems, circuits and methods for the programming of NVM cells and more particularly for programming MLC's.

SUMMARY OF THE INVENTION

According to some embodiments of the present invention, a multi-level cell ("MLC") memory array may be programmed using a programming circuit having a binary input register to store binary data to be input into the MLC array and a register to store a programming vector, where each element in the programming vector corresponds to an MLC in the array. A controller may map pairs of bits from the input register to elements in the programming vector, such that mapping a pair of bits to an element of the programming vector may set the vector element to a "program" value if the pair of bits corresponds to a specific program state or set of program states associated with the programming vector.

According to some embodiments of the present invention, a programming vector may be associated with only one program level or state, while in other embodiments of the present invention, a programming vector may be associated with two or more program levels or states.

As part of some embodiments of the present invention, the controller may map pairs of bits to a second programming vector associated with a second program state. Furthermore, a separate programming vector may be mapped for each program state of the MLC.

According to some further embodiments of the present invention, the controller may apply programming pulses to each MLC in the array corresponding to vector elements whose values are set at a "program" value. The controller may reset each element of a vector to a "do-not-program" value once the MLC corresponding to the vector element has been fully programmed to the program state with which the given programming vector is associated.

According to some embodiments of the present invention, each MLC may include multiple charge storage regions (e.g.

dual bit NROM cell). In cases where an MLC array is comprised of cells having multiple charge storage regions, each charge storage region may be treated as a single MLC.

In some embodiments of the present invention, the controller only maps one programming vector at a time. In other embodiments of the present invention, the controller may map multiple programming vectors, where each vector is associated with a specific program state. However, in further embodiments of the present invention, a programming vector may be associated with more than one program state. In one embodiment of the present invention, a programming vector may be associated with a first programming state and may be further associated with one or more higher programming states corresponding to higher programming levels (or threshold voltages).

In some embodiments of the present invention, the controller may apply programming pulses to the MLC array using only one programming vector at a time. In other embodiments of the present invention, the controller may apply programming pulses to the MLC array using multiple programming vectors at the same time, where each vector is associated with a different program level or different set of program levels. In some embodiments of the present invention, when an MLC reaches a target program state during programming, the MLC's corresponding programming vector element may be reset to a "do-not-program" value.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features and advantages thereof, may best be understood by reference to the following non limiting detailed description when read with the accompanied drawings in which:

It will be appreciated that for simplicity and clarity of these non-limiting illustrations, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE INVENTION

In the following detailed description, numerous specific details are set forth in order to provide a thorough understanding of the invention. However it will be understood by those of ordinary skill in the art that the present invention may be practiced without these specific details. In other instances, well-known methods and procedures have not been described in detail so as not to obscure the present invention.

In the field of Multi Level Cells (MLCs), the "11" state of an MLC is sometimes used to described the erased state of the MLC. However, for the purposes of illustration, with reference to some embodiments of the present invention, throughout the specification and the claims of the present invention, the "11" state of an MLC and similar terms may be used to describe a program state of an MLC. It should be noted, that the use of the term "11" to describe a program state of an MLC is for illustration purposes only, and is not intended to limit the scope of the present application, nor to surrender or limit any subject matter whatsoever.

According to some embodiments of the present invention, a multi-level cell ("MLC") memory array may be programmed using a programming circuit having a binary input register to store binary data to be input into the MLC array and a register to store a programming vector, where each element in the programming vector corresponds to an MLC in the array. A controller may map pairs of bits from the input register to elements in the programming vector, such that mapping a pair of bits to an element of the programming vector may set the vector element to a "program" value if the pair of bits corresponds to a specific program state associated with the programming vector.

According to some embodiments of the present invention, a programming vector may be associated with only one program level or state, while in other embodiments of the present invention, a programming vector may be associated with two or more program levels or states.

As part of some embodiments of the present invention, the controller may map pairs of bits to a second programming vector associated with a second program state. A separate programming vector may be mapped for each program state of the MLC. However, in further embodiments of the present invention, a programming vector may be associated with more than one program state. In one embodiments of the present invention a programming vector may be associated with a first programming state and may be further associated with one or more higher programming states corresponding to higher programming levels (or threshold voltages).

According to some further embodiments of the present invention, the controller may apply programming pulses to each MLC in the array corresponding to vector elements whose values are set at a "program" value. The controller may reset each element of a vector to a "do-not-program" value once the MLC corresponding to the vector element has been fully programmed to the program state with which the given programming vector is associated.

In some embodiments of the present invention, the controller only maps one programming vector at a time. In other embodiments of the present invention, the controller may map multiple programming vectors, where each vector is associated with a specific program state.

According to some embodiments of the present invention, each MLC may include multiple charge storage regions (e.g. dual bit NROM cell). In cases where an MLC array is comprised of cells having multiple charge storage regions, each charge storage region may be treated as a single MLC.

In some embodiments of the present invention, the controller may apply programming pulses to the MLC array using only one programming vector at a time. In other embodiments of the present invention, the controller may apply programming pulses to the MLC array using multiple programming vectors, at the same time where each vector is associated with a different program level. In some embodiments of the present invention, when an MLC reaches a target program state during programming, the MLC's corresponding programming vector element may be reset to a "do-no-program" value.

Figure 1A:
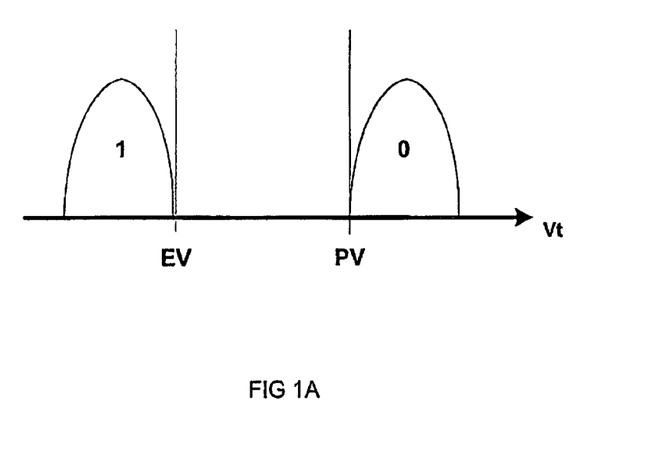
FIG. 1A shows a voltage distribution graph depicting possible threshold voltage distributions in the charge storage region of a binary non-volatile memory cell, wherein vertical lines depict boundary values correlated with each of the cell's possible program states.

Turning now to FIG. 1A, there is shown a voltage distribution graph depicting possible threshold voltage distributions in a charge storage region of a binary non-volatile memory cell, wherein vertical lines depict boundary values correlated with each of the cell's possible program states. A vertical line titled erase voltage ("EV") on the left side of the graph depicts the highest possible threshold voltage below which a NVM cell must be considered in an erased state (e.g. 1). A vertical line titled program voltage ("PV") on the right side of the graph depicts the lowest possible threshold voltage at which a NVM cell may be considered in a programmed state (e.g. 0). The curves in each of the regions may correspond to the actual threshold voltages at which a NVM may be while in each of the two states. The curves may be probabilistic or deterministic in nature.

Figure 1B:
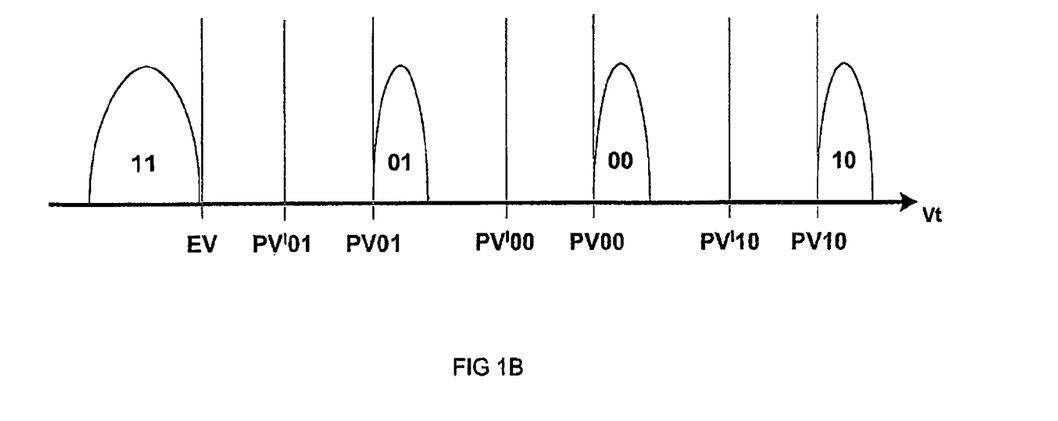
FIG. 1B shows a voltage distribution graph depicting possible threshold voltage distributions in the charge storage region of a four level non-volatile memory cell, wherein one set of vertical lines depict boundary values correlated with each of the cell's possible states, and another set depict boundary lines for "slow program" regions in front of each of the cell's program states.

Turning now to FIG. 1B, there is shown a voltage distribution graph depicting possible threshold voltage distributions in the charge storage region of a four level non-volatile memory cell, wherein one set of vertical lines depicts boundary values correlated with each of the cell's possible states (PVXX), and another set depicts boundary lines for "slow program" regions in front of each of the cell's program state (PV'XX). A vertical line titled erase voltage ("EV") on the left side of the graph depicts the highest possible threshold voltage below which a NVM cell must be considered in an erased state (e.g. "01"). The threshold voltage region between the vertical lines titled program voltage ("PV'01") and program voltage ("PV01") may represent a slow program region within which an MLC programming algorithm may continue to apply slow or small programming pulses to get the MLC into a program state (e.g. "01") associated with the program voltage PV01. Regions of the graph bound by threshold voltages defined as PV'00 and PV00, and PV'10 and PV10, define slow program regions for program states "00" and "10", respectively. The curves in each of the regions may correspond to the actual threshold voltages at which an NVM may be while in each of the two states. The curves may be probabilistic or deterministic in nature.

Figure 2:
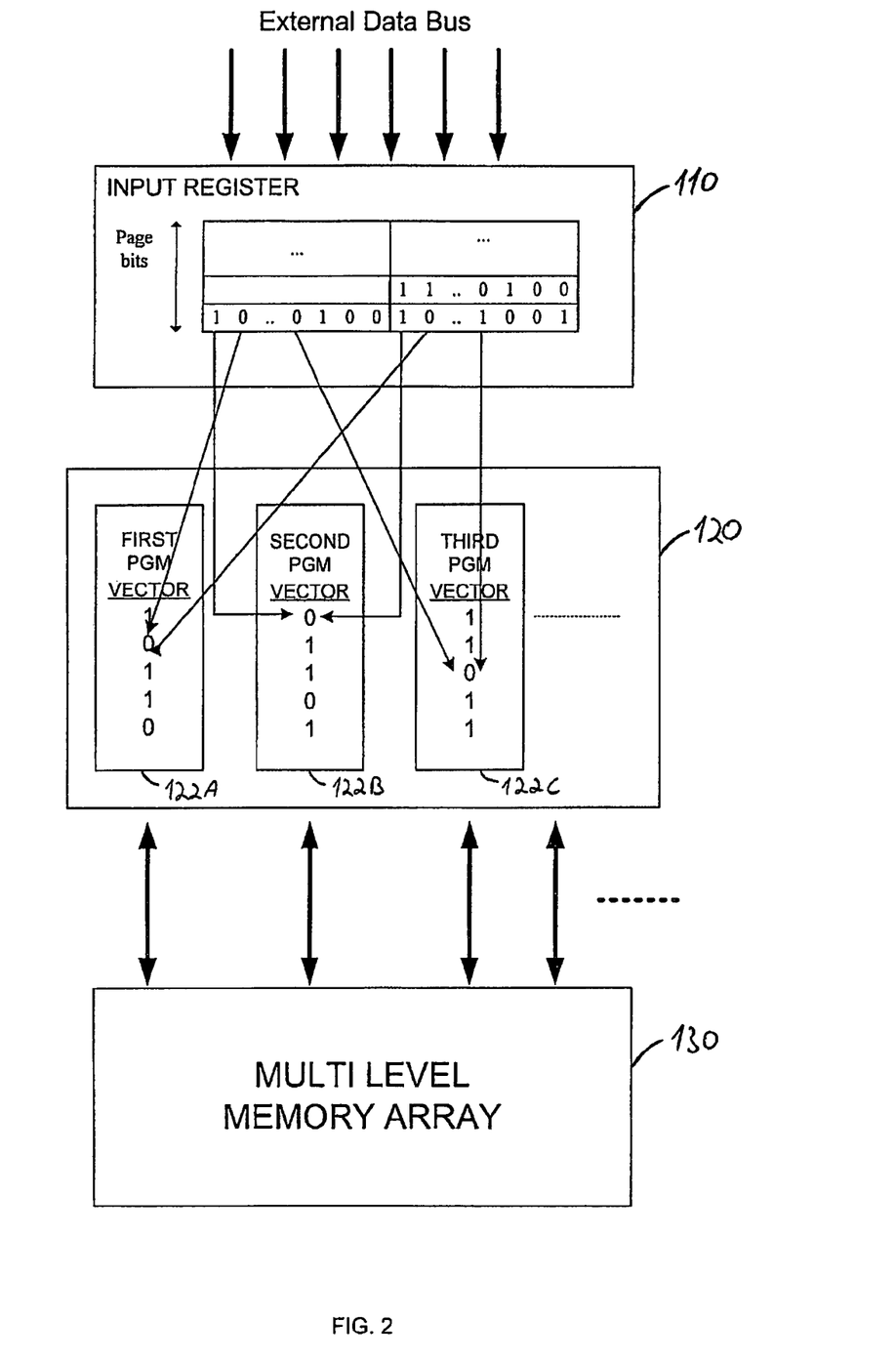
FIG. 2 shows a block diagram of an MLC programming circuit according to some embodiments of the present invention.

Turning now to FIG. 2, there is shown a block diagram of an MLC programming circuit 100, according to some embodiments of the present invention. As part of the programming circuit, there may be an input register 110 to receive data over an external data bus, which data may be programmed onto an MLC array 130. Programming vectors 122A, 122B and 122C may reside in either a second register 120 or, in some embodiments of the present invention, may reside in a portion of the input register 110.

In some embodiments of the present invention, the input register 110 may include volatile memory of a static random access memory (SRAM) or a dynamic random access memory (DRAM) architecture. In some embodiments of the present invention, the second register 120 may include volatile memory of an SRAM or DRAM architecture. Memory registers for programming NVM are well known, and any registers known today or to be devised in the future are applicable to the present invention.

Various on-chip, external and internal, data bus architectures are known. Any such architectures, known today or to be devised in the future are applicable to the present invention.

As part of some embodiments of the present invention, data (e.g. pairs of bits) from the input register 110, to be stored on the MLC 130, may be first mapped onto one or more programming vectors 122, where each programming vector 122 is associated with a specific program state. Mapping of bits (e.g. pairs, three at a time, four at a time, etc. . . . ) from the input register 110 to the programming vectors 122 may be performed according to various patterns, including those exemplified in FIGS. 3A to 3C, and in accordance with various algorithms, including the algorithm exemplified in the flow diagram of FIG. 5.

Figure 3A:
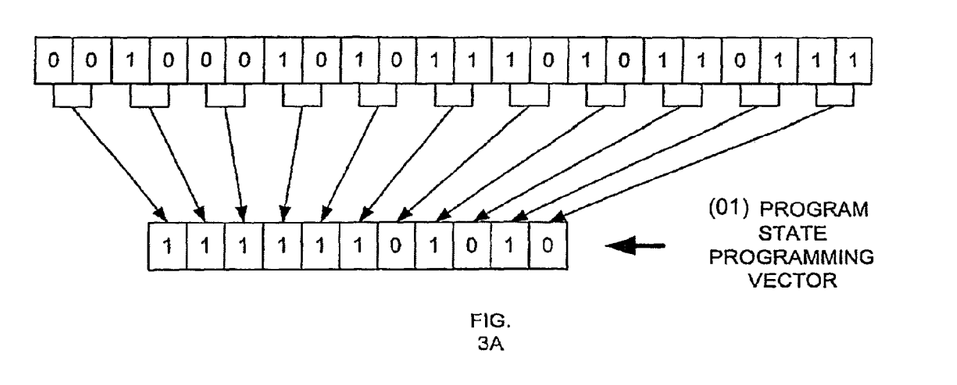
FIG. 3A shows a block diagram depicting a mapping of pairs of bits from an input register to elements of a programming vector associated with a (01) program state.

Turning now to FIG. 3A, there is shown a block diagram depicting a mapping of pairs of bits from an input register to elements of a programming vector associated with a "01" program state. For segments of data in an input register 110 to be programmed, groups of bits (e.g. pairs of bits) may be mapped from the register 110 to one or more programming vectors. Each of the programming vectors may be associated with a specific program state. Each element in the programming vector 122 may be correlated to a specific cell in an MLC array 130, and the mapping of bits from the register 110 may be such that the value of the vector element to which a pair of bits is mapped indicates whether the MLC to which the element is correlated should be programmed to a state associated with the programming vector 122. For example, in FIG. 3A, the first pair of bits on the left are mapped to a first element of programming vector 122A, where vector 122A is associated with a program state 01. Since the first pair of bits are "00" and the vector is associated with a program state "01", the first vector element is set to a "do-not-program value", which in this case is "1". However, as should be clear to those of ordinary skill in the art, either "0" or "1" may be designated as either the "program" or "do-not-program" values for a programming vector 122 and/or a programming circuit according to some embodiments of the present invention.

As further exemplified by the rightmost bit in the input register 110 of FIG. 3A, when a pair of bits is mapped to a programming vector 122 such that the logical value of the pair of bits matches the program state associated with the vector 122, the vector 122 element to which the pair is mapped is set to a "program" value, which in this example is "0".

Figure 3B:
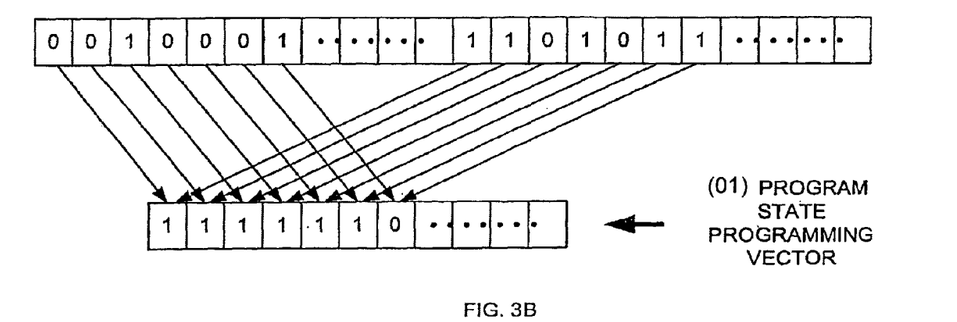
FIG. 3B shows a block diagram illustrating a mapping of pairs of bits from the same register as in FIG. 3A, wherein each bit of the pair is from a different portion of an input register, to an element of a programming vector associated with a (01) program state.

Turning now to FIG. 3B, there is shown a block diagram illustrating a mapping of pairs of bits, wherein each bit of the pair is from a different portion of an input register 110, to an element of a programming vector associated with a "01" program state. According to some embodiments of the present invention, mapping of bits from an input register 110 to a program vector 122 may be performed according to a pattern matching up bits from different portions of the register. For example, if 128 bits are mapped from a program register 110 to a 64 element (e.g. 64 bit) programming vector 122, the $N^{th}$ element in the programming vector 122 bit may be a mapping from the $(N^{th})$ and $(64+N^{th})$ bits of the input register 110. In the example of FIG. 3B, the program vector is associated with a "01" program state, and thus, all pairs of bits with the logical value of "01" may result in the setting of the element to which they are mapped to be set to a "program" value (e.g. "0"). All other pairs of bits may be mapped such that elements in the programming vector 122 to which they are mapped are set to a "do-not-program" value (e.g. "1"). It will be obvious to those skilled in the art that other patterns are possible and are within the scope of the present invention.

Figure 3C:
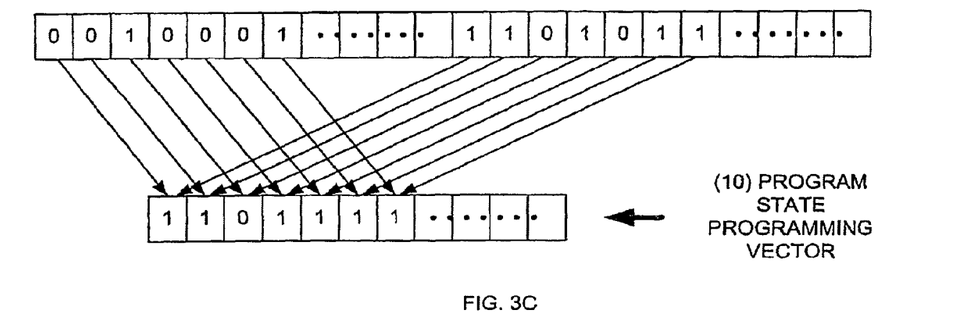
FIG. 3C shows a block diagram illustrating a mapping of pairs of bits from the same register as in FIGS. 3A & 3B, wherein each bit of the pair is from a different portion of the input register, to an element of a programming vector associated with a (10) program state.

Turning now to FIG. 3C, there is shown a block diagram illustrating a mapping of the same pairs of bits and according to the same pattern as in FIG. 3B, to elements of a programming vector associated with a "10" program state. As may be seen, because the programming vector 122B, to which the same bits as in FIG. 3B are mapped, is associated to a program state "10", the vector elements resulting from a mapping of the same source bits are different than the vector elements of FIG. 3B.

Although some embodiments of the present invention may be directed towards programming circuits utilizing programming vectors associated with a specific program state, it should be noted that the present invention is not limited in this respect, and rather, a variety of additional programming vectors may be used, in accordance with further embodiments of the present invention. For example, according to some embodiments of the present invention a programming vector may be associated with two or more program states.

According to some embodiments of the present invention a programming vector may be associated with a first program state and with a second program state. A variety of programming algorithms may be devised for utilizing such programming vectors. For instance, according to one exemplary programming algorithm, initially, cells of an MLC array to be programmed to the first program state and cells to be programmed to the second program state may receive programming pulses concurrently. After all the cells associated with each of the vector elements have been programmed to at least the first program state and all the vector elements are marked with a "Program" value, a second program vector may be generated, where elements correlated to cells to be programmed to the second, and possibly to a third program state are marked with a "Program" value. The cells associated with these elements may then be pulsed with programming pulses until each has been programmed to the second program state or level. It should be understood by one skilled in the art, that a program vector according to some embodiments of the present invention may be associated with any number of program states. A variety of additional programming algorithms utilizing programming vectors associated with two or more programming states may be devised by those of ordinary skill in the art.

Figure 4A:
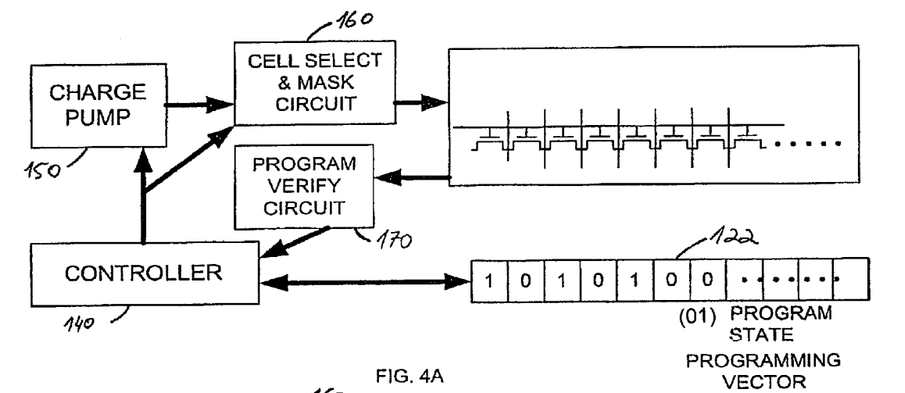
FIG. 4A shows a block diagram illustrating a portion of a programming circuit according to some embodiments of the present invention which uses a programming vector which was mapped with paired bits from an input register associated with a (01) program state in order to program the MLC associated with each of the elements in the programming vector.

Turning now to FIG. 4A, there is shown a block diagram illustrating a portion of a programming circuit, according to some embodiments of the present invention, which uses a programming vector which was mapped with grouped or paired bits form an input register associated with a "01" program state in order to program the MLC associated with each of the elements in the programming vector. The portion of the programming circuit of FIG. 4A may be explained in conjunction with a description of FIG. 5, which shows a flow chart diagram depicting the stages of a method by which a set of MLCs may be programmed.

Figure 5:
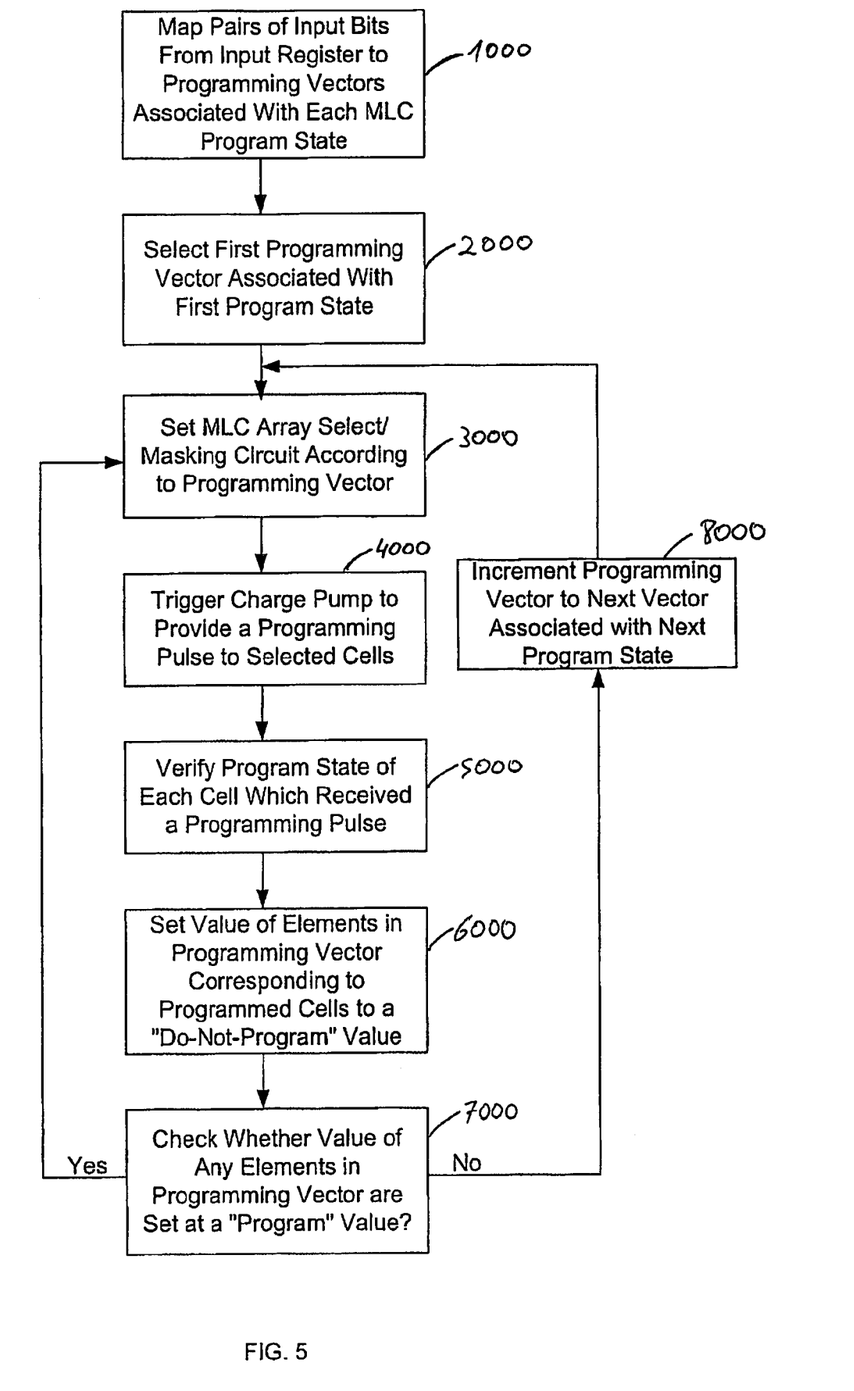
FIG. 5 shows a flow chart diagram depicting a method by which a set of MLCs may be programmed using one or more programming vectors according to some embodiments of the present invention.

According to stage 1000, pairs of bits from an input register may be mapped to programming vectors 122. The mapping may be done in the manner described above or according to any other pattern. As seen in FIG. 4A, each element of a programming vector 122 may correspond to an MLC in an MLC array 130. A series of bits from an input register 110 may be mapped to either one programming vector 122A at a time or to several programming vectors 122A to 122C in parallel. The controller 140 may select a programming vector 122 associated with a first programming state (stage 2000) to which cells in the MLC are to be programmed, in the example of FIG. 4A the programming vector is associated with a "01" program state.

Based on the elements of the programming vector 122, the controller may instruct a cell select and masking circuit 160 to provide a charge pump 150 with access to the MLCs corresponding to the elements of the vector 122 (stage 3000) whose values are set at a "program" value (e.g. "0"). In the example of FIG. 4A, the MLCs corresponding to the second, forth, sixth, and seventh elements of the vector 122 may be selected for programming to the program state associate with the vector 122 (e.g. "01").

Once the select circuit 160 provides access to the MLC cells corresponding to the vector elements whose values are set at a "program" state, the controller 140 may trigger the charge pump 150 (stage 4000) to produce a charging or programming pulse which may raise the threshold voltage of the selected cells to the threshold voltage associated with the programming vector "01". After the programming pulse, the controller 140 may use a program verify circuit 170 to check the program state of each of the cells which received a programming pulse (stage 5000) and may reset the value of any vector element from "program" to "do-not-program" for those elements associated with a cell that has reached the program state associated with the vector 122 (stage 6000).

Vector elements associated with cells that have not reached the target program state may be left at a "program" value, and the controller 140 may return to stage 3000 where it may instruct the cell select and mask circuit 160 to provide access to the cells needing additional charging pulses and to mask those cells which have been fully programmed. Stages 3000 to 7000 may be repeated in a loop until all the cells requiring charging have been charged to the target state and all the elements of the programming vector have been reset to a "do-not-program" value.

Figure 4B:
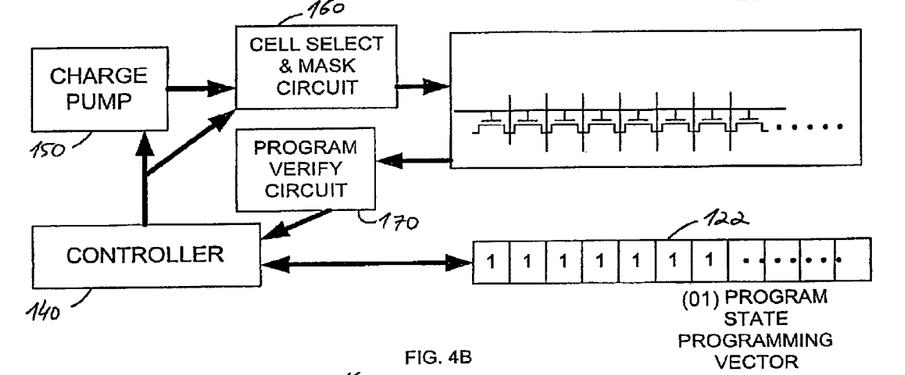
FIG. 4B shows the block diagram of the circuit of FIG. 4A, after the programming circuit has successfully programmed each of the MLCs to the (01) program state and after the circuit has set each of the elements in the programming vector to a "do-not-program" value (e.g. a value of 1)
Figure 4C:
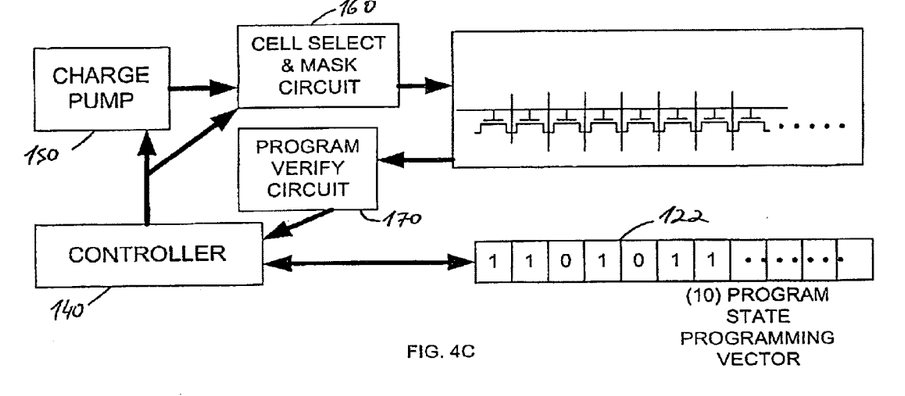
FIG. 4C shows the block diagram of the circuit of FIG. 4A, wherein the programming vector being used is associated with a (10) program state.

When the controller 140 determines at some point that all the elements in the programming vector 122 have been reset to a "do-not-program" value (stage 7000), as is exemplified in FIG. 4B, the controller 140 may proceed to use a successive program vector 122 (stage 8000). FIG. 4B, shows the block diagram of the circuit of FIG. 4A, after the programming circuit has successfully programmed each of the MLC cells to the ("01") program state and after the circuit has set each of the elements in the programming vector to a "do-not-program" value (e.g. a value of "1"). FIG. 4C shows the block diagram of the circuit of FIG. 4A, after stage 8000, wherein the programming vector 122 being used is associated with a ("10") program state, rather than the "01" program state, of FIG. 4A.

According to some embodiments of the present invention, blocks of data may be programmed onto an MLC array in data segments corresponding to a set of programming vectors, where each programming vector is associated with a specific program state. For each data segment, a set of programming vectors may be generated, and each programming vector may be used to program a corresponding set of MLCs, such that the programming vector's elements may be reset to a "do-not-program" value as corresponding MLCs complete charging. According to some embodiments of the present invention, an input register 110 used to generate the set of programming vectors may remain uncorrupted or unchanged as the MLCs are programmed. While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

The invention claimed is:

1. A method of programming a multi-level cell (MLC) memory array comprising deriving a programming vector associated with at least one specific program state, wherein the programming vector is derived by mapping a first pair of bits from a binary input register to a first element in the programming vector.

2. The method according to claim 1, wherein each element in the programming vector corresponds to a single charge storage region of an MLC in the memory array.

3. The method according to the claim 2, further comprising mapping a second pair of bits from a binary input register to a second element in a programming vector.

4. The method according to claim 1, wherein mapping a pair of bits to an element of the programming vector comprises setting the element value to a "program" value if the pair of bits corresponds to the at least one specific program state with which the programming vector is associated.

5. The method according to claim 1, wherein mapping a pair of bits to an element of said programming vector comprises setting the element value to a "do-not-program" value if said pair of bits does not correspond to the at least one specific program state with which the programming vector is associated.

6. The method according to claim 1, wherein the vector is associated with each of two or more specific program states.

7. The method according to claim 6, wherein the two or more specific program states comprise at least a first program state and a second program state, wherein the second program state is associated with a higher threshold voltage than the first program state.

8. The method according to claim 7, further comprising concurrently programming a set of cells, wherein at least two cells in the set of cells are programmed to different threshold voltages.

9. A method of programming a multi-level cell (MLC) memory array comprising: deriving at least one programming vector associated with at least two specific program states, and concurrently programming a set of cells, wherein at least two cells in the set of cells are designated for programming to different threshold voltages corresponding to the at least two specific program states.

10. A multi-level cell ("MLC") memory array programming circuit comprising: a controller adapted to map a first pair of bits from an input register to a first element of a programming vector associated with at least one specific program state.

11. The circuit according to the claim 10, further comprising a binary input register adapted to store data to be written into an MLC array.

12. The circuit according to claim 10, further comprising a programming vector register adapted to store a programming vector.

13. The circuit according to claim 12, wherein each element in the programming vector corresponds to a charge storage region of an MLC in the array.

14. The circuit according to claim 13, wherein said controller is further adapted to map a second pair of bits from said binary input register to a second element in the programming vector.

15. The circuit according to claim 10, wherein said controller maps a pair of bits to an element of the programming vector by setting the element value to a "program" value if the pair of bits corresponds to the at least one specific program state with which the programming vector is associated.

16. The circuit according to claim 10, wherein said controller maps a pair of bits to an element of the programming vector by setting the element value to a "do-not-program" value if the pair of bits does not correspond to the at least one specific program state with which the programming vector is associated.

17. The circuit according to claim 15, wherein said controller causes a programming pulse to be applied to each MLC charge storage region in the array corresponding to a vector element whose value is set at a "program" value.

18. The circuit according to claim 17, wherein said controller causes a vector element value to be se to "do-not-program" once the MLC corresponding to the element is programmed to the at least one program state with which the programming vector is associated.

19. The circuit according to claim 10, wherein said controller is adapted to map pairs of bits from said binary input register to the elements of a second programming vector associated with a second program state and wherein mapping a pair of bits to an element of the second programming vector comprises setting the element to a "program" value if the pair of bits corresponds to the second program state with which the second vector is associated.

20. The circuit according to claim 10, wherein the vector is associated with each of two or more specific program states.

21. The circuit according to claim 20, wherein the two or more specific program states comprise at least a first program state and a second program state, wherein the second program state is associated with a higher threshold voltage than the first program state.

22. The circuit according to claim 21, wherein said controller is adapted to cause concurrent program of a set of cells, wherein at least two cells in the set of cells are programmed to different threshold voltages.

23. A multi-level cell ("MLC") memory device comprising a non-volatile memory array; and a controller adapted to map a first pair of bits from an input register to a first element of a programming vector associated with at least one specific program state.

24. The device according to the claim 23, further comprising a binary input register adapted to store data to be written into an MLC array.

25. The device according to claim 23, further comprising a programming vector register adapted to store a programming vector.

26. The device according to claim 25, wherein each element in the programming vector corresponds to a charge storage region of an MLC in the array.

27. The device according to claim 26, wherein said controller is further adapted to map a second pair of bits from said binary input register to a second element in the programming vector.

28. The device according to claim 23, wherein said controller maps a pair of bits to an element of the programming vector by setting the element value to a "program" value if the pair of bits corresponds to the at least one specific program state with which the programming vector is associated.

29. The device according to claim 23, wherein said controller maps a pair of bits to an element of the programming vector by setting the element value to a "do-not-program" value if the pair of bits does not correspond to the at least one specific program state with which the programming vector is associated.

30. The device according to claim 28, wherein said controller causes a programming pulse to be applied to each MLC charge storage region in the array corresponding to a vector element whose value is set at a "program" value.

31. The device according to claim 30, wherein said controller causes a vector element value to be se to "do-not-program" once the MLC corresponding to the element is programmed to the at least one program state with which the programming vector is associated.

32. The device according to claim 23, wherein said controller is adapted to map pairs of bits from said binary input register to the elements of a second programming vector associated with a second program state and wherein mapping a pair of bits to an element of the second programming vector comprises setting the element to a "program" value if the pair of bits corresponds to the second program state with which the second vector is associated.

33. The device according to claim 23, wherein the vector is associated with each of two or more specific program states.

34. The device according to claim 33, wherein the two or more specific program states comprise at least a first program state and a second program state, wherein the second program state is associated with a higher threshold voltage than the first program state.

35. The device according to claim 34, wherein said controller is adapted to cause concurrent program of a set of cells, wherein at least two cells in the set of cells are programmed to different threshold voltages.

* * * * *